United States Patent
Banks

(10) Patent No.: US 7,301,160 B2
(45) Date of Patent: Nov. 27, 2007

(54) ION SOURCES

(75) Inventor: Peter Michael Banks, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/857,449

(22) Filed: Jun. 1, 2004

(65) Prior Publication Data

US 2005/0211923 A1 Sep. 29, 2005

(30) Foreign Application Priority Data

Mar. 26, 2004 (GB) ................ 0406882.1

(51) Int. Cl.
*H01J 37/08* (2006.01)
*H01J 37/317* (2006.01)

(52) U.S. Cl. .............. 250/492.21; 250/492.3; 250/426; 250/425; 250/424; 250/423 R; 313/363.1; 315/111.81

(58) Field of Classification Search ......... 250/492.21, 250/492.3, 426, 424, 423 R, 425, 281, 282
See application file for complete search history.

(56) References Cited

U.S. PATENT DOCUMENTS

| 4,883,969 A * | 11/1989 | Ishida et al. ............ 250/427 |
|---|---|---|
| 5,445,710 A | 8/1995 | Hori et al. |
| 5,620,526 A * | 4/1997 | Watatani et al. ........... 134/1.1 |
| 5,656,820 A | 8/1997 | Murakoshi et al. |
| 6,135,128 A * | 10/2000 | Graf et al. ............... 134/1.1 |
| 6,355,933 B1 | 3/2002 | Tripsas et al. |
| 2003/0230986 A1 | 12/2003 | Horsky et al. |

FOREIGN PATENT DOCUMENTS

| EP | 0945892 | 9/1999 |
|---|---|---|
| EP | 1061550 | 12/2000 |

OTHER PUBLICATIONS

Patent Abstracts of Japan, vol. 016, No. 291 (Jun. 26, 1992) of JP 04 074419A (Fujitsu Ltd.), entitled Manufacture of Semiconductor Device.
Patent Abstracts of Japan, vol. 1998, No. 01 (Jan. 30, 1998) of JP 09 249975 A (Central Glass Co. Ltd.), entitled Gas Cleaning Method of Tungsten or Tungsten Compound Film Forming Device.

* cited by examiner

*Primary Examiner*—Nikita Wells
(74) *Attorney, Agent, or Firm*—Boult Wade Tennant

(57) ABSTRACT

The invention relates to methods of controlling the effect of ions of an ionisable source gas that can react with interior surfaces of an arc chamber, by introducing ions of a displacement gas into the arc chamber, where the displacement gas ions are more chemically reactive with the material of the interior surfaces than the ions of the source gas. The source gas ions may typically be oxygen ions and the displacement gas ions are then typically fluorine ions where the interior surfaces comprise tungsten. The fluorine ions may, by way of example, be sourced from fluorine, silicon tetrafluoride or nitrogen trifluoride.

15 Claims, 2 Drawing Sheets

ION SOURCES

FIELD OF THE INVENTION

This invention is concerned with improvements in or relating to ion sources particularly though not exclusively for use in or with implantation apparatus used to implant ions into semiconductor substrates in the manufacture of semiconductor devices.

BACKGROUND OF THE INVENTION

A typical ion source of the type with which the present invention is concerned comprises an ionisation, or arc, chamber (also sometimes referred to as a plasma chamber) into which source material can be introduced. A plasma is generated in the chamber in which the source material is ionised, and the ions are drawn off, by one or more extraction electrodes, through an outlet from the chamber. One typical ionisation chamber has a pair of cathodes arranged in opposed relationship, one referred to as a cathode and the other as a counter cathode. In use, the cathode is heated and emits electrons. The counter cathode then repels the electrons so that they are entrained between the two electrodes. The counter cathode may be connected to be at the same potential as the cathode or may be allowed to float.

The cathode and counter cathode are typically made of tungsten which has a high melting point (approx. 3700° K), and in some chambers, the interior surfaces of the chamber are formed of or coated with tungsten. Due to its high melting point, tungsten is normally unaffected by the temperatures generated within the chamber (c. 1000° C.) other than to emit electrons into the chamber to create, and sustain the plasma. The chamber is typically within a magnetic field which causes the electrons to move in fixed paths (e.g. spiral) between the cathode and counter cathode. Ionisation of the source material is achieved by the application of energy to the source material in a number of different ways, e.g. by applying an arc potential between the cathode and the chamber body, or in other types of ionisation chamber by use of r.f. or microwave energy. An extraction electrode which (for positive ions) is negatively biased relative to the chamber itself is mounted at the outlet from the chamber, typically outside the chamber. The negatively biased extraction electrode draws the ions through the outlet and the ions then pass through an aperture in the extraction electrode to the rest of the ion implantation apparatus.

Many different types of ions are implanted into substrates to impart required characteristics and properties to the resultant substrate.

Where it is desired to implant carbon or oxygen into a substrate, carbon dioxide has been selected as the most preferred source for carbon ions and is also suitable for oxygen ions, because carbon dioxide is plentiful, relatively safe to use and cheap to produce.

When producing carbon ions, it is also preferred to use carbon dioxide rather than carbon monoxide, even though ion yields would be higher from carbon monoxide, due to the known toxicity of the latter.

However, in using carbon dioxide in an arc chamber, it has been found that the actual presence of oxygen ions in the chamber reduces the useful life of the ion source due to the production of stoichiometric and non-stoichiometric oxides of tungsten at the electrodes and, where other tungsten surfaces are present in the chamber, at those surfaces as well. These oxides form within the chamber and it has been observed that the ion source becomes contaminated by the formation of these oxides and ceases to function efficiently within a few tens of hours. The oxides build up to form a barrier to the emission of electrons from the tungsten electrode and to conduction at the other tungsten surfaces of the chamber forming the anode. This effect can be regarded as 'poisoning' of the arc chamber, and occurs both when carbon ions are to be extracted from the ion source and when oxygen ions are to be extracted.

In U.S. Pat. No. 6,135,128 (Graf et al.), a method of cleaning an ion source comprising a plasma chamber has been proposed in which a dopant gas, selected from phosphine ($PH_3$) containing phosphorus (P) arsine ($AsH_3$) containing arsenic (As), germane ($GeH_4$) and germanium tetrafluoride ($GeF_4$) both containing germanium (Ge), and diborane ($B_2H_6$) containing boron (B), together with nitrogen trifluoride ($NF_3$) as a cleaning gas, are introduced into the plasma chamber and ionised at temperatures of about 1000° C. The purpose of introducing the cleaning gas is to remove deposits of phosphorus or arsenic or germanium or boron, as the case may be, from interior surfaces of the plasma chamber when, without the presence of the cleaning gas, they can quite readily form such deposits on those surfaces. Where a plasma chamber is being operated to produce one or other of these species of ions alone, the matter of formation of deposits of the element in question is not problematic. However, typically, plasma chambers are used to produce ions of different species, and residue of one material on the interior walls of the plasma chamber will lead to impurities and contamination being present when creating an ion beam of another ion species.

The disclosure of Graf et al. is related to removal of depositable material from a plasma chamber. This can be achieved by varying the flow rate of the cleaning gas to remove any material which might be deposited as it is formed.

SUMMARY OF THE INVENTION

The present invention has as its principal objective to improve the efficiency of an ion source having an arc chamber comprising interior surfaces particularly electrode surfaces, which can react with a constituent ion species present in a plasma created in the chamber and so "poison" the chamber.

The present invention provides, in one aspect, a method of producing ions for implantation into a substrate, comprising providing an arc chamber having electrodes with exposed surfaces of a material which can react with oxygen to form an electrically non conducting oxide layer; feeding into the arc chamber a source gas containing atoms of oxygen; generating an arc between the electrodes in the arc chamber to create a plasma in which ions of a species desired for implantation are formed from the source gas, said plasma containing oxygen ions; and feeding into the arc chamber, simultaneously with said source gas, a displacement gas containing atoms of fluorine, so that said material of the electrode surfaces reacts with fluorine from the displacement gas, displacing oxygen, to reduce formation of said oxide layer.

It should be understood that references throughout this specification to a gas, e.g. "source gas" or "displacement gas" are intended to cover not only a gas at normal temperature and pressure but also other gaseous materials such as vapours.

The presence of the fluorine containing displacement gas reduces the tendency for poisoning oxides to form on the electrodes of the arc chamber, thereby helping to maintain the efficiency of production of ions desired for implantation.

The invention is especially useful when operating an ion source to produce a beam of carbon ions or a beam of oxygen ions using $CO_2$ as the source gas. Using $SiF_4$ as the displacement gas is preferred especially for carbon ions, since resultant ionic species extracted from the arc chamber can easily be mass separated from the required $^{12}C$. However other fluorine containing gases may be used such as $BF_3$, $NF_3$ or $CF_4$, or fluorine gas itself.

The cathodes in ion source arc chambers are typically made of a refractory metal such as tungsten or molybdenum, or an alloy of these. Usually, the body of the arc chamber forms the anode and the interior surfaces of the chamber are usually lined also with tungsten, molybdenum, or an alloy of these metals.

For carbon or oxygen ion beams, CO may be used as the source gas instead of $CO_2$. For oxygen ion beams, the source gas may be oxygen gas or any other gaseous oxide such as nitric oxide.

The invention can also be useful for implanting antimony (Sb), for which a common feed material is $Sb_2O_3$. This is naturally a solid and is fed to the arc chamber as a vapour from a vaporiser oven.

The invention also provides a method of implanting ions of oxygen, carbon or antimony.

The invention further provides an implantation apparatus comprising an ion source for generating a beam of ions desired for implantation into a substrate, the ion source containing an arc chamber having electrodes with exposed surfaces of a material which can react with oxygen to form an electrically non conducting oxide layer; a supply of a source gas containing atoms of oxygen; a source of displacement gas containing atoms of fluorine; an arc supply to apply an arc voltage between said electrodes in the arc chamber for establishing a plasma in the arc chamber; an extraction electrode which can be biased to extract ions from the chamber; a mass analyser to filter the extracted ions to provide a beam of the desired ions directed at the substrate; and a controller to feed said source gas and said displacement gas simultaneously from said supplies into the arc chamber, so that said material of the electrode surfaces reacts with fluorine from the displacement gas to reduce formation of said oxide layer.

DETAILED DESCRIPTION OF A PREFERRED EMBODIMENT

Figure 1:
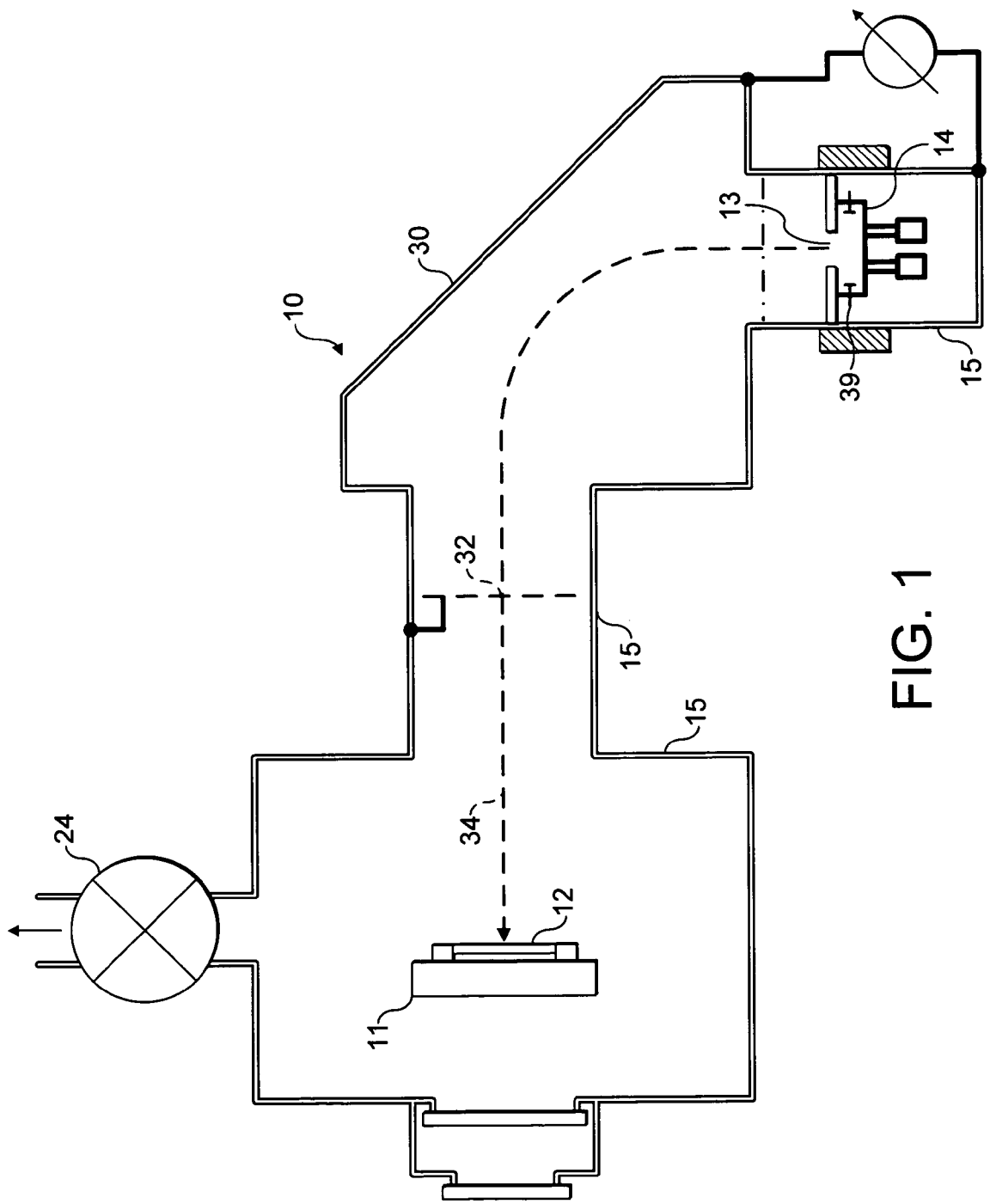
FIG. 1 is a schematic drawing of an ion implanter.

FIG. 1 illustrates an ion implantation apparatus generally indicated at 10. This apparatus is used for implanting ions into semiconductor substrates or wafers one of which is shown at 12 mounted on a support 11; the ions are produced by an ion source generally indicated at 14. The ions are directed in the form of a beam 34 by a mass-analyser generally indicated at 30 towards the substrate 12. Mass analysis is carried out by the analyser and then desired ions are selected by a slit 32 which only permits passage of ions having a desired mass/charge ratio to progress to the substrate. The ion source 14, mass analyser 30 and wafer support 11 are all mounted in a vacuum chamber 15 which is maintained under vacuum by one or more vacuum pumps, schematically indicated at 24.

Figure 2:
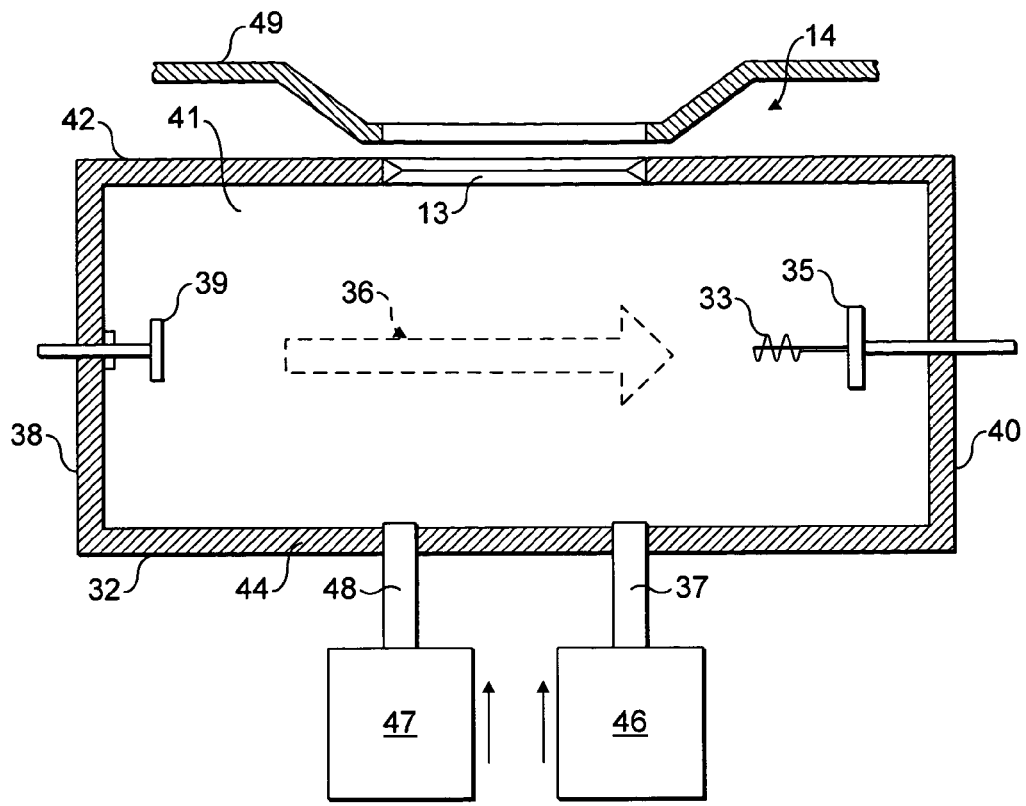
FIG. 2 is a schematic drawing of an ion source in which a method according to the present invention can be performed.

The ion source 14 is shown in greater detail in FIG. 2. Referring to FIG. 2, this illustrates in cross-section a Bernas ion source 14, viewed in section from one side in the drawing of FIG. 1. The ion source 14 comprises an arc or ionization chamber 32 which, as can be seen from FIG. 2, is defined by a housing which is substantially cuboid in shape and comprises end walls 38, 40, side walls, only one of which 41 is shown, front wall 42 and rear wall 44. The walls of the ionization chamber are ideally formed of or lined with a material, e.g. tungsten or graphite.

A filament 33 extends through wall 40 at one end forming a cathode with a counter-cathode 39 extending through wall 38 at the other end of the ionization chamber. An additional reflector 35 is located between the filament 33 and the wall 40 of the chamber.

In operation, the filament 33 is heated by a current to emit thermal electrons and the cathode filament 33 together with both the counter cathode 39 and the reflector 35 are biased at a substantial negative potential relative to the housing 32. The emitted electrons are accelerated by the bias field and constrained to travel in helical paths between the filament 33 and the counter cathode 39 by a magnetic field 36 between external magnetic poles (not shown in the drawing) and extending between the filament and the counter cathode. Instead of the directly heated filament cathode 33 illustrated in FIG. 2, an indirectly heated cathode may be provided such as described in WO 03/075305, GB-A-2387963 and U.S. Pat. No. 6,259,210.

A supply 46 of source gas is connected to the ionization chamber 32 via a first inlet 37 and a supply 47 of a displacement gas is connected to the arc chamber 32 by a further inlet 48. Instead the source and displacement gases may be combined and fed into the arc chamber via a single inlet.

As the gases enter the chamber 36, they are dissociated and/or ionized to form a plasma of charged particles. Positively charged ions are extracted from the ionization chamber through a slit 13 in the front wall 42 by an extraction potential between the ionization chamber and an extraction electrode 49, and directed onto the mass analyser 30.

In constructing the ionization chamber illustrated in FIG. 2, it is common to use refractory metals such as tungsten and molybdenum for the cathode electrodes and the interior wall surfaces of the chamber 30 which provide the anode. However, when carbon dioxide alone has been used formerly to provide the source gas (from which ions of carbon and oxygen can be obtained), it has been found that the surfaces of the electrodes and walls or liners of the chamber are affected by the presence of the oxygen ions, so that the tungsten forms oxides with the oxygen ions. Oxygen ions permeate the crystalline structure of the tungsten and the oxides build up, particularly on the electrodes and liners, to an extent such that the efficiency of the ion source is reduced until eventually electrons are no longer released from the cathode or absorbed by the wall liners. This process is called "poisoning" of the source.

The displacement gas provided by the supply 47 reduces this problem.

The displacement gas contains fluorine atoms and when ionised, provides ions which have a greater affinity for tungsten than oxygen, thereby reversing, retarding and/or preventing formation of the oxides on the electrode surfaces within the chamber. Fluorine has been found to displace oxygen where this has combined with tungsten and, where oxides have formed, to convert them to tungsten fluoride with the liberation of oxygen into the plasma.

The displacement gas can be selected from fluorine gas, boron trifluoride ($BF_3$), nitrogen trifluoride ($NF_3$), silicon tetrafluoride ($SiF_4$) and carbon tetrafluoride ($CF_4$). Where the desired species for implantation is carbon, $BF_3$ is best avoided because of the problem of contaminating the carbon ion beam directed at the substrate with boron ($^{11}B$), which has an atomic mass close to that of $^{12}C$ and may not therefore be separated by the mass analyser. Other possible gases may be $SF_6$ and $GeF_4$, although $SF_6$ can cause unwanted deposits of sulphur which is an insulator, and $GeF_4$ may also cause unwanted deposits.

Figure 3:
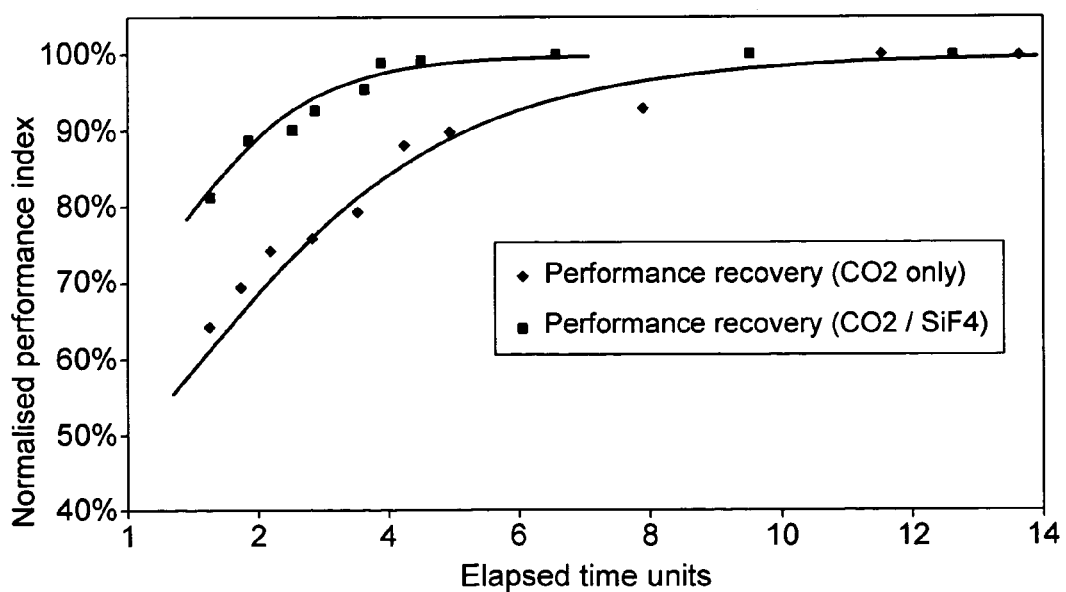
FIG. 3 is a graphical illustration of the advantages of examples of the invention.

FIG. 3 illustrates the improvement in performance that can be obtained when implanting carbon by providing $SiF_4$ as a displacement gas simultaneously with the source gas $CO_2$.

After employing an implanter to implant carbon for a few hours, for example, using $CO_2$ as source gas alone, the available beam current of carbon ions may decline only slightly. However, when the implanter is then switched over to implant another species, such as boron, there can be a significant reduction in available beam current of boron ions, and the full expected boron beam current may be recovered and become obtainable only after two or more hours of running the boron beam.

In FIG. 3, the slow recovery of an ion source running a boron beam after poisoning by running a carbon beam using $CO_2$ as source gas alone, is illustrated by the lower curve. Recovery to something approaching full expected beam current (100% on the normalised performance index of the y-axis) may take 10 time units (say 2½ hours).

The upper curve in FIG. 3 shows the recovery rate after running the same carbon beam for the same period, but with $SiF_4$ displacement gas in addition to $CO_2$ source gas. Not only is the initial performance about 70% of the expected current, instead of 50% for $CO_2$ source gas alone, but the full recovery time is reduced to about four units (say 1 hour).

The flow rate of $SiF_4$ required to achieve the best performance can be established empirically. If the flow of $SiF_4$ is too low in proportion to the flow of the source gas (e.g. $CO_2$), then the advantageous effect is lost and poisoning of the source is not reduced. If the relative rate of $SiF_4$ is too high, the yield of $C^+$ ions in the plasma can be reduced with corresponding reduction in available $C^+$ ion current. Also, if the flow rate of the combined gases is too high the source pressure is increased, with increased risk of arcing between extraction electrodes etc. Even if a required beam current of $C^+$ ions can still be achieved, excessive current of $Si^+$ and $F^+$ ions in the beam extracted from the arc chamber can cause problems of erosion and contamination along the beam line of the implanter. The improvement illustrated in FIG. 3 was obtained with a relative flow rate of $CO_2$ to $SiF_4$ of 6:1.

Although the example illustrated in FIG. 3 relates to generating a carbon beam using $CO_2$ as source gas, $SiF_4$ as displacement gas, and electrodes with tungsten surfaces, similar improvements in performance are obtained when selecting an oxygen beam from the extracted ions. Also, other electrode metals may be used, such as molybdenum and alloys thereof with tungsten. Other oxygen atom containing source gases may be used with other fluorine atom containing displacement gases to reduce the above described poisoning effect.

The invention claimed is:

1. A method of producing a beam of ions of a desired species for implantation into a substrate, using:
    an arc chamber having electrodes with exposed surfaces of a material which reacts with oxygen to form an electrically non conducting oxide layer;
    the desired species being one which is derived from predetermined oxygen containing source gas molecules in a source gas fed into the arc chamber;
    an arc being generated between the electrodes in the arc chamber to create a plasma in which ions of said desired species are formed from the source gas molecules, said plasma containing oxygen ions; and
    ions being extracted from the arc chamber and filtered to provide a beam of said ions of said desired species directed at the substrate;
    wherein said method includes the step of
    feeding into the arc chamber, simultaneously with said source gas molecules displacement gas molecules containing fluorine and not containing oxygen so that said material of the electrode surfaces reacts with fluorine from the displacement gas molecules, displacing oxygen, to reduce formation of said oxide layer.

2. A method according to claim 1, wherein said material of the electrode surfaces is selected from tungsten, molybdenum and alloys thereof.

3. A method according to claim 1, wherein the displacement gas molecules are silicon tetrafluoride.

4. A method according to claim 1, wherein the displacement gas molecules are selected from F, $NF_3$ and $BF_3$.

5. A method according to claim 1, wherein the source gas molecules are carbon dioxide or carbon monoxide.

6. A method according to claim 1, wherein the source gas molecules are selected from oxygen and oxides of nitrogen.

7. A method according to claim 1, wherein the source gas molecules are $Sb_2O_3$ in a vapour.

8. A method of implanting oxygen ions into a substrate, using:
    an arc chamber having electrodes with exposed surfaces of a material which reacts with oxygen to form an electrically non conducting oxide layer;
    the oxygen ions being derived from predetermined oxygen containing source gas molecules in a source gas fed into the arc chamber,
    an arc being generated between the electrodes in the arc chamber to create a plasma containing oxygen ions; and
    ions being extracted from the arc chamber and filtered to provide a beam of oxygen ions directed to the substrate;
    wherein said method includes the step of
    feeding into the arc chamber, simultaneously with said source gas molecules, displacement gas molecules containing fluorine and not containing oxygen, so that said material of the electrode surfaces reacts with fluorine from the displacement gas molecules, displacing oxygen, to reduce formation of said oxide layer.

9. A method of implanting according to claim 8, wherein the source gas molecules are selected from oxygen and oxides of nitrogen.

10. A method of implanting carbon ions into a substrate using:
    an arc chamber having electrodes with exposed surfaces of a material which reacts with oxygen to form an electrically non conducting oxide layer;

the carbon ions being derived from predetermined source gas molecules containing oxygen and carbon in a source gas fed into the arc chamber;

an arc being generated between the electrodes in the arc chamber to create a plasma containing oxygen ions and carbon ions; and ions being extracted from the arc chamber and filtered to provide a beam of carbon ions directed at the substrate;

wherein said method includes the step of feeding into the arc chamber, simultaneously with said source gas molecules, displacement gas molecules containing fluorine and not containing oxygen, so that said material of the electrode surfaces reacts with fluorine from the displacement gas molecules, displacing oxygen, to reduce formation of said oxide layer.

11. A method of implanting antimony ions into a substrate using:

an arc chamber having electrodes with exposed surfaces of a material which reacts with oxygen to form an electrically non conducting oxide layer;

the antimony ions being derived from predetermined source gas molecules containing oxygen and antimony in a source gas fed into the arc chamber;

an arc being generated between the electrodes in the arc chamber to create a plasma containing oxygen ions and antimony ions; and ions being extracted from the arc chamber and filtered to provide a beam of antimony ions directed at the substrate;

wherein said method includes the step of feeding into the arc chamber, simultaneously with said source gas molecules, displacement gas molecules containing fluorine and not containing oxygen, so that said material of the electrode surfaces reacts with fluorine from the displacement gas molecules, displacing oxygen, to reduce formation of said oxide layer.

12. A method of implanting according to any one of claims 8 to 11, wherein the material of the exposed surfaces of the electrodes is selected from tungsten, or molybdenum, and alloys thereof.

13. A method of implanting according to either one of claims 8 and 10, wherein the source gas molecules are selected from carbon dioxide and carbon monoxide.

14. A method of implanting according to any one of claims 8 to 11, wherein the displacement gas molecules are selected from F, $SiF_4$, $NF_3$ and $BF_3$.

15. A method of implanting according to claim 10, wherein the source gas molecules are $Sb_2O_3$.

* * * * *